United States Patent [19]
Lee et al.

[11] Patent Number: 6,141,292
[45] Date of Patent: Oct. 31, 2000

[54] CLOCK GENERATING CIRCUITS THAT UTILIZE ANALOG PUMP SIGNALS TO PROVIDE FAST SYNCHRONIZATION AND REDUCED DELAY SKEW

[75] Inventors: Dong-yun Lee; Dae-yun Shim, both of Kyungki-do; Won-Chan Kim, Seoul, all of Rep. of Korea

[73] Assignee: Samsung Electronics Co., Ltd., Rep. of Korea

[21] Appl. No.: 09/383,805

[22] Filed: Aug. 26, 1999

[30] Foreign Application Priority Data

Aug. 27, 1998 [KR] Rep. of Korea ................. 98-34882

[51] Int. Cl.[7] ............................................. G11C 13/00
[52] U.S. Cl. ................ 365/233; 365/189.05; 365/230.08
[58] Field of Search .................... 365/189.05, 230.08, 365/233

[56] References Cited

U.S. PATENT DOCUMENTS

| | | | |
|---|---|---|---|
| 5,666,323 | 9/1997 | Zagar | 365/233 |
| 5,742,194 | 4/1998 | Saeki | 327/298 |
| 5,748,554 | 5/1998 | Barth et al. | 365/230.03 |
| 5,815,462 | 9/1998 | Konishi et al. | 365/233 |
| 5,818,788 | 10/1998 | Kimura et al. | 365/230.03 |
| 5,822,268 | 10/1998 | Kirihata | 365/230.03 |
| 5,892,730 | 4/1999 | Sato et al. | 365/233 |

OTHER PUBLICATIONS

Saeki et al., A 2.5–ns Clock Access, 250–MHz, 256–Mb SDRAM With Synchronous Mirror Delay, IEEE Journal of Solid State Circuits, vol. 31, No. 11, Nov. 1996, pp. 1656–1665.

Han et al., *Skew Minimizing Techniques for the Synchronous DRAMs Beyond 256 M–bit*, Symp. VLSI Circuits, Jun. 1996, pp. 192–193.

*Primary Examiner*—Terrell W. Fears
*Attorney, Agent, or Firm*—Myers Bigel Sibley & Sajovec

[57] ABSTRACT

Clock generating circuits include a clock buffer, a delay mirror circuit (DMC), a clock frequency divider circuit and a clock generator circuit. The clock buffer is responsive to an external clock signal EXTCLK and generates a buffered clock signal ICLK in response to the external clock signal EXTCLK. The buffered clock signal ICLK is delayed relative to the external clock signal EXTCLK by a fixed buffer delay time "dtb". The delay mirror circuit (DMC) is responsive to the buffered clock signal ICLK and generates a delayed clock signal IDCLK. The delayed clock signal IDCLK is delayed relative to the buffered clock signal ICLK by a fixed delay-mirror time "dtot". The clock frequency divider circuit is responsive to the buffered clock signal ICLK and the delayed clock signal IDCLK. The clock frequency divider circuit includes first and second divider devices that generate first and second divided clock signals VDIV1 and VDIV2, respectively. The clock generator circuit is responsive to VDIV1 and VDIV2 and includes a control signal generator, an analog pump signal generator and a driver circuit. Based on this configuration of the above-described circuits, only 2 clock periods are required before the rising edge of the internal clock signal INTCLK is in-sync and in-phase with the external clock signal EXTCLK.

17 Claims, 4 Drawing Sheets

CLOCK GENERATING CIRCUITS THAT UTILIZE ANALOG PUMP SIGNALS TO PROVIDE FAST SYNCHRONIZATION AND REDUCED DELAY SKEW

RELATED APPLICATION

This application is related to Korean Application No. 98-34882, filed Aug. 27, 1998, the disclosure of which is hereby incorporated herein by reference.

FIELD OF THE INVENTION

The present invention relates to integrated circuit devices, and more particularly to integrated circuit devices that generate clock signals.

BACKGROUND OF THE INVENTION

Integrated circuit devices such as synchronous dynamic random access memory (SDRAM) devices typically include internal clock generating circuits that generate internal clock signals in-sync with an externally applied clock signal. In an SDRAM, many of the internally generated signals are generated in response to the internal clock signal. For example, the internal clock signal may control the timing of circuits which output data from the SDRAM and receive data into the SDRAM.

Conventional SDRAMs typically synchronize an internal clock signal to an external clock signal using a phase-locked loop (PLL) or a delay-locked loop (DLL). Both the PLL and DLL utilize feedback to insure that exact synchronization is achieved.

Techniques have also been developed for reducing the power consumed by SDRAMs. Such techniques often include the use of a power-down or standby mode. During these modes, certain circuits within the SDRAM are made inactive and consume less power. However, when switching from a standby mode to an active mode, some time is typically required to stabilize the PLL or DLL circuits and the duration of this time is typically influenced greatly by the operating speed of the SDRAM. Moreover, because PLL and DLL circuits typically utilize feedback, several hundred to several thousand clock cycles may be required before such circuits become stabilized when reentering an active mode.

Synchronous delay inversion technologies have been employed to reduce the time required to achieve synchronous operation upon resumption of an active mode. An example of this technology is disclosed in an article by Saeki et al., entitled "A 2.5 ns Clock Access 250 MHz 256 Mb SDRAM with a Synchronous Mirror Delay", ISSCC96, Paper SP 23.4, pp. 374–375 (1996), and in U.S. Pat. No. 5,742,194 to Saeki, entitled "Internal Clock Generator for a Synchronous Dynamic RAM". Unfortunately, this synchronous delay inversion technology may require the use of a digital circuit. In particular, the delay time corresponding to the electrostatic capacitance of the SDRAM and characteristics of the input/output multiplexer is digitized and this digitization may result in a quantization error. In addition, a delay error can be generated in the output clock signals generated using the delay inverter having an quantization error. The maximum time of the error corresponds to the time of one step during digitization. The step time is the delay time of the inverter. Since the delay time of an inverter may exceed 100 picoseconds, the error associated with the output clock can be greater than 100 ps. Thus, notwithstanding the conventional use of PLLs or DLLs to obtain synchronization, there still exists a need for improved circuits for generating internal clock signals with improved synchronization.

SUMMARY OF THE INVENTION

It is therefore an object of the present invention to provide a clock generating circuit which uses preferred clock synchronization techniques to efficiently match the phase of an internal clock signal to an external clock signal.

These and other objects, advantages and features of the present invention are provided by an internal clock generating circuit that can generate an internal clock signal in-sync with an external clock signal and provide zero clock skew between the external and internal clock signals after only two clock periods. According to a preferred embodiment of the present invention, an internal clock generating circuit comprises a clock buffer, a delay mirror circuit (DMC), a clock frequency divider circuit and a clock generator circuit. The clock generator circuit comprises a control signal generator, an analog pump signal generator and a driver circuit. The clock buffer is responsive to an external clock signal EXTCLK and generates a buffered clock signal ICLK in response to the external clock signal EXTCLK. The buffered clock signal ICLK is delayed relative to the external clock signal EXTCLK by a fixed buffer delay time "dtb". The delay mirror circuit (DMC) is responsive to the buffered clock signal ICLK and generates a delayed clock signal IDCLK. The delayed clock signal IDCLK is delayed relative to the buffered clock signal ICLK by a fixed delay-mirror time "dtot". The clock frequency divider circuit is responsive to the buffered clock signal ICLK and the delayed clock signal IDCLK.

According to a preferred aspect of the present invention, the clock frequency divider circuit includes first and second divider devices that generate first and second divided clock signals VDIV1 and VDIV2, respectively. The first divider device divides the frequency of the delayed clock signal IDCLK in half and adds a fixed delay "dt1". The second divider device divides the frequency of the buffered clock signal ICLK in half and adds a fixed delay "dt1". The first divider device and the second divider device preferably comprise T-type flip flops (TFF) of conventional design.

A clock generator circuit is also provided. The clock generator circuit converts the first and second divided clock signals VDIV1 and VDIV2 into an internal clock signal INTCLK having a frequency that is N times the frequency of the first and second divided clock signals, where N is an integer greater than one. The control signal generator generates first and second pairs of up/down control signals (UP1/DN1 and UP2/DN2) in response to the first and second divided clock signals VDIV1 and VDIV2. The pump signal generator generates first and second analog pump signals VPUMP1 and VPUMP2 in response to the first pair of up/down control signals UP1/DN1 and the second pair of up/down control signals UP2/DN2. The driver circuit generates the internal clock signal INTCLK in response to the first and second analog pump signals VPUMP1 and VPUMP2.

The driver circuit comprises first and second operational amplifiers that are responsive to the first and second analog pump signals VPUMP1 and VPUMP2. Because the positive (+) terminal of each amplifier is responsive to the reference potential VREF, the output VCOM1 of the first operational amplifier will be driven to a logic 1 potential whenever the magnitude of VPUMP1 is less than VREF and the output VCOM2 of the second operational amplifier will be driven to a logic 1 potential whenever the magnitude of VPUMP2 is less than VREF. Alternatively, the output VCOM1 of the first operational amplifier will be driven from a logic 1 potential to a logic 0 potential whenever the magnitude of VPUMP1 increases above VREF and the output VCOM2 of the second operational amplifier will be driven from a logic 1 potential to a logic 0 potential whenever the magnitude of VPUMP2 increases above VREF. A buffer circuit is also provided. This buffer circuit includes a NOR gate and a chain of four (4) inverters which convert the output of the NOR gate into an internal clock signal INTCLK. Based on this configuration of the driver circuit, the rising and falling edges of the internal clock signal INTCLK which be synchronized with the analog pump signals VPUMP1 and VPUMP2. In particular, the internal clock signal INTCLK will transition from low to high whenever the magnitude of VPUMP1 drops below VREF or the magnitude of VPUMP2 drops below VREF. The internal clock signal INTCLK will also transition from high to low whenever the magnitude of VPUMP1 rises above VREF or the magnitude of VPUMP2 rises above VREF. Based on this configuration of the above-described circuits, only 2 clock periods are required before the rising edge of the internal clock signal INTCLK is in-sync and in-phase with the external clock signal EXTCLK.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
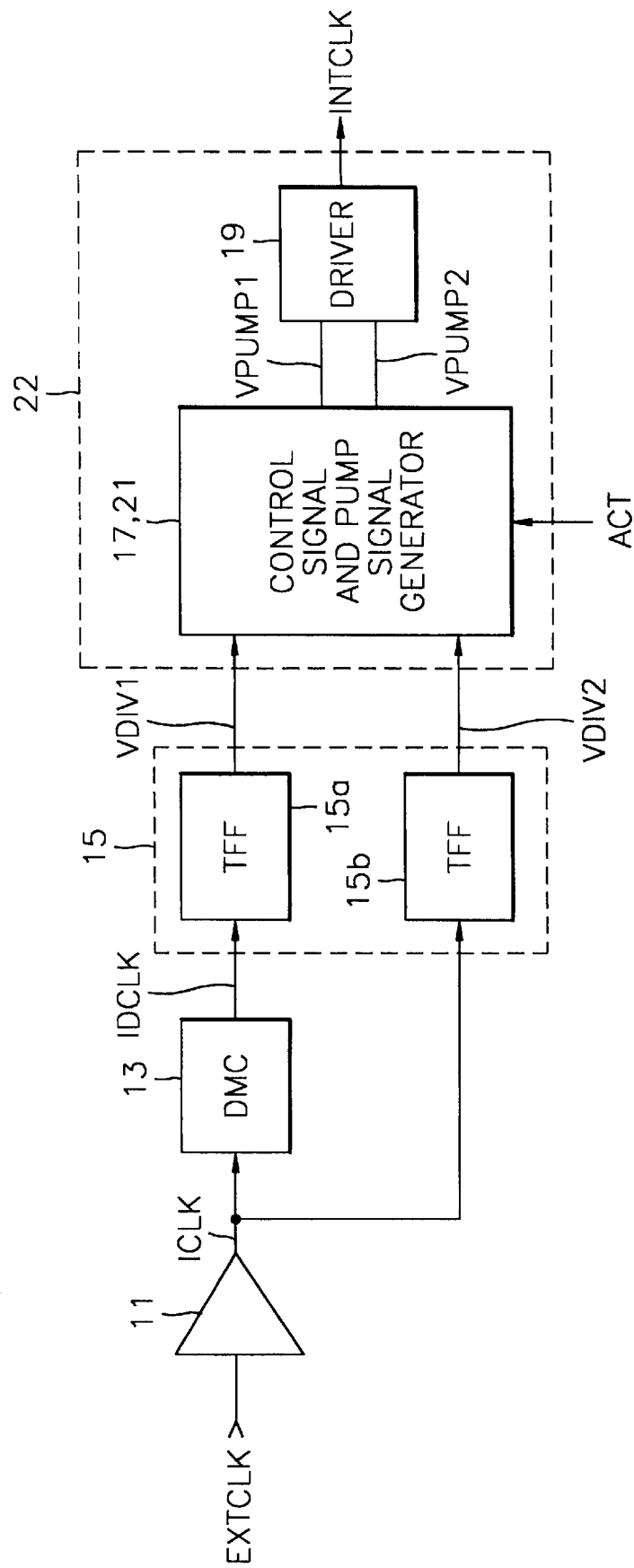
FIG. 1 is an electrical schematic of an integrated circuit device according to a first embodiment of the present invention.
Figure 4:
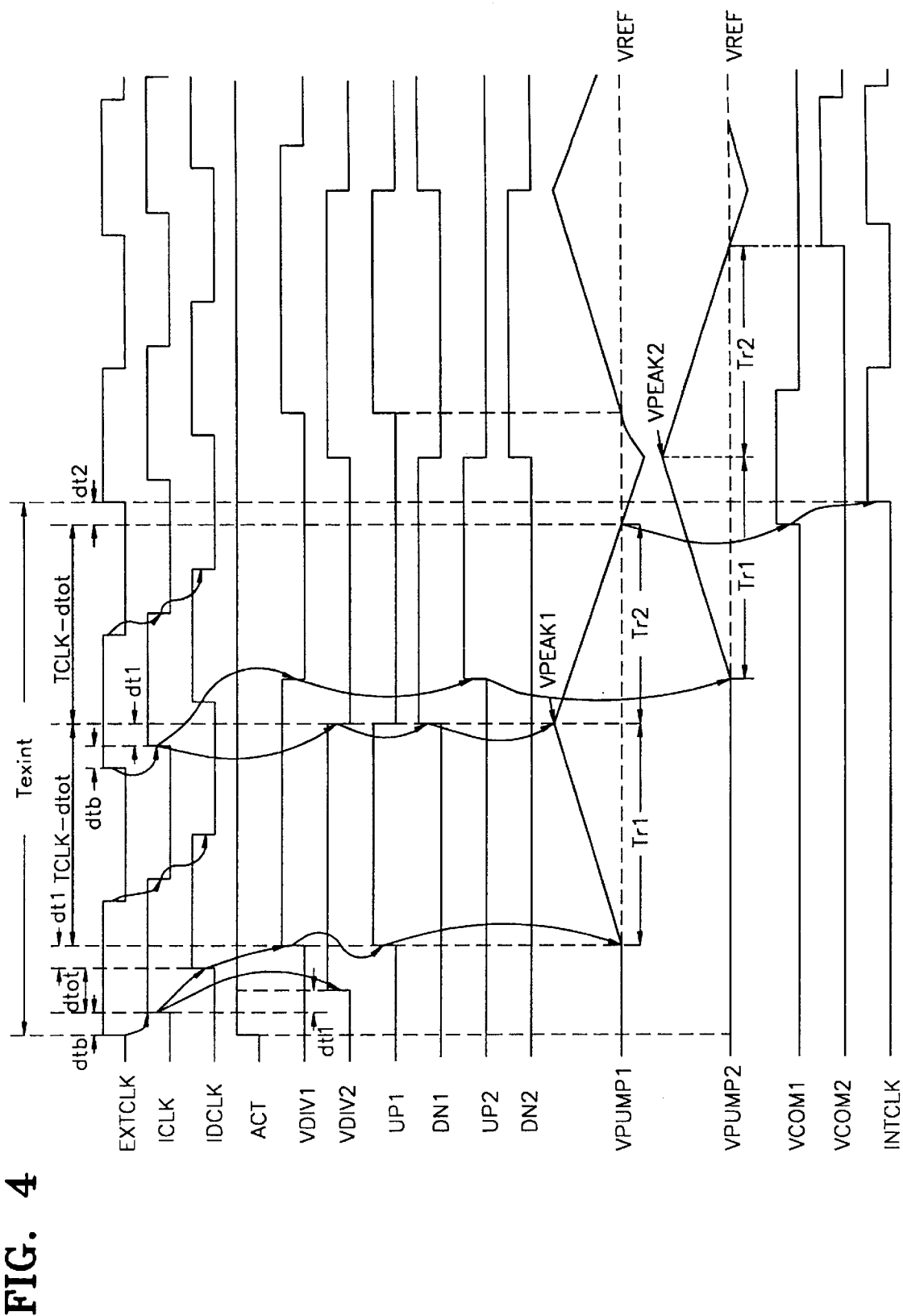
FIG. 4 is a timing diagram which illustrates operation of the device of FIG. 1.

Referring now to FIG. 1, an internal clock generating circuit according to a preferred embodiment of the present invention is illustrated. This internal clock generating circuit comprises a clock buffer 11, a delay mirror circuit (DMC) 13, a clock frequency divider circuit 15 and a clock generator circuit 22. The clock generator circuit 22 comprises a control signal generator 21, an analog pump signal generator 17 and a driver circuit 19. The clock buffer 11 is responsive to an external clock signal EXTCLK and generates a buffered clock signal ICLK in response to the external clock signal EXTCLK. The buffered clock signal ICLK is delayed relative to the external clock signal EXTCLK by a fixed buffer delay time "dtb", as illustrated by FIG. 4. The delay mirror circuit (DMC) 13 is responsive to the buffered clock signal ICLK and generates a delayed clock signal IDCLK.

As illustrated by FIG. 4, the delayed clock signal IDCLK is delayed relative to the buffered clock signal ICLK by a fixed delay-mirror time "dtot". The clock frequency divider circuit 15 is responsive to the buffered clock signal ICLK and the delayed clock signal IDCLK.

According to a preferred aspect of the present invention, the clock frequency divider circuit 15 includes first and second divider devices 15a and 15b that generate first and second divided clock signals VDIV1 and VDIV2, respectively. The first divider device 15a divides the frequency of the delayed clock signal IDCLK in half and adds a fixed delay "dt1". The second divider device 15b divides the frequency of the buffered clock signal ICLK in half and adds a fixed delay "dt1". The timing of these first and second divided clock signals is illustrated by FIG. 4. The first divider device 15a and the second divider device 15b preferably comprise T-type flip flops (TFF) of conventional design.

Figure 2:
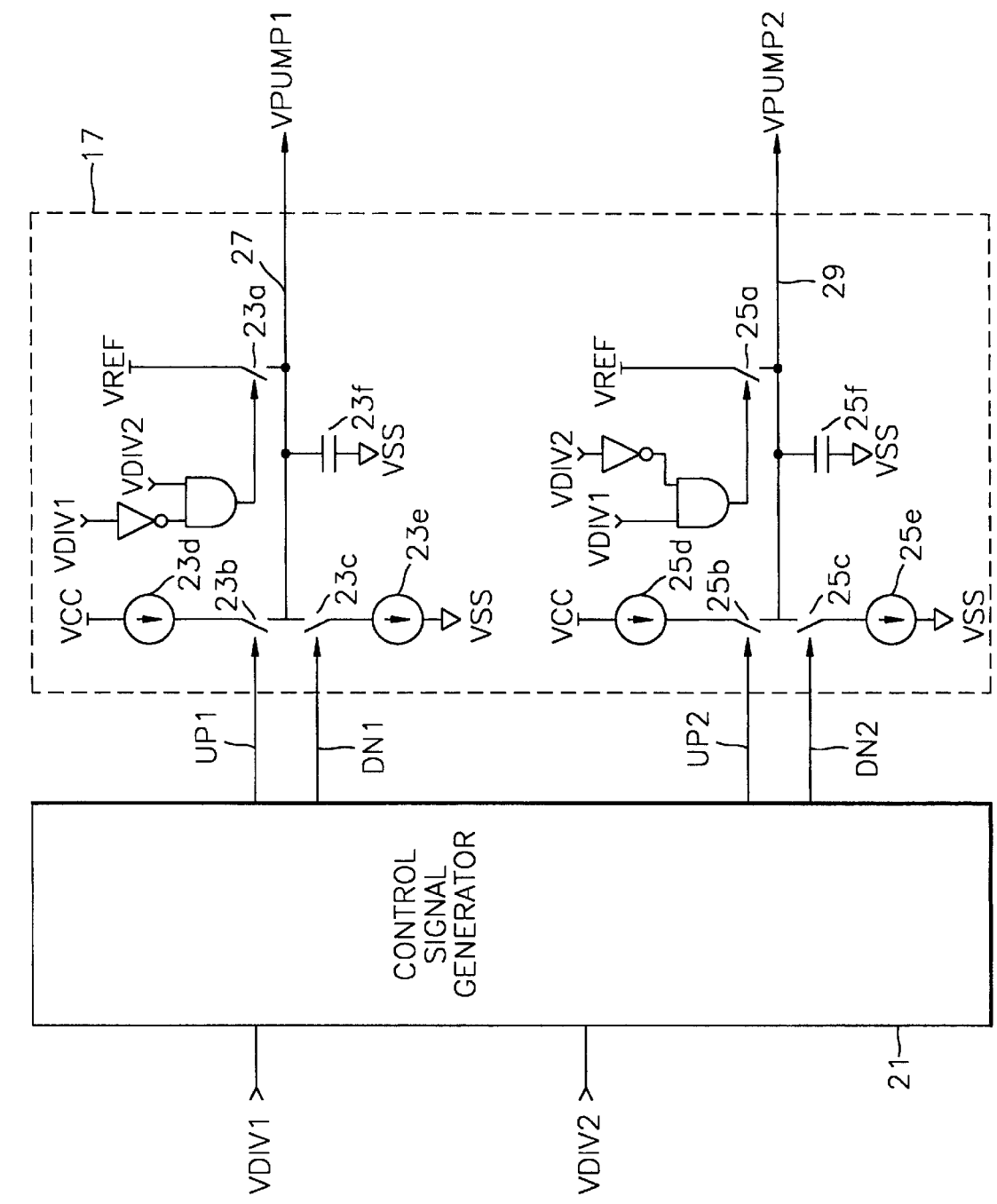
FIG. 2 is an electrical schematic of a preferred control signal generator and preferred pump signal generator according to the embodiment of FIG. 1.

Referring now to FIGS. 1–2, a clock generator circuit 22 is also provided. The clock generator circuit 22 converts the first and second divided clock signals VDIV1 and VDIV2 into an internal clock signal INTCLK having a frequency that is N times the frequency of the first and second divided clock signals, where N is an integer greater than one. The clock generator circuit 22 preferably comprises a control signal generator 21, a pump signal generator 17 and a driver circuit 19. The control signal generator 21 generates first and second pairs of up/down control signals (UP1/DN1 and UP2/DN2) in response to the first and second divided clock signals VDIV1 and VDIV2. The control signal generator 21 may also be responsive to an activation signal ACT. The pump signal generator 17 generates first and second analog pump signals VPUMP1 and VPUMP2 in response to the first pair of up/down control signals UP1/DN1 and the second pair of up/down control signals UP2/DN2. The driver circuit 19 generates the internal clock signal INTCLK in response to the first and second analog pump signals VPUMP1 and VPUMP2.

Figure 3:
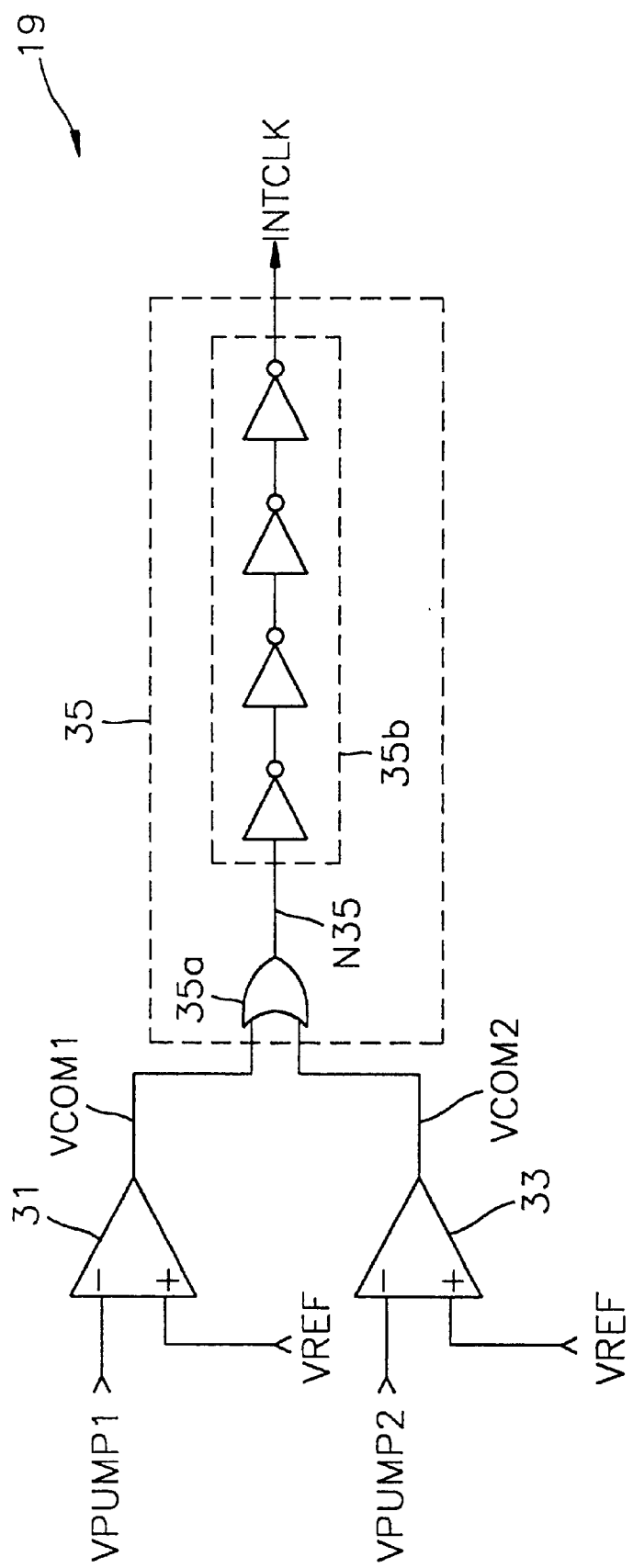
FIG. 3 is an electrical schematic of the driver circuit of FIG. 1.

Referring now to FIGS. 2–4, the control signal generator 21 generates control signal UP1 in a logic 1 state in a period when the first and second divided clock signals VDIV1 and VDIV2 are both in logic 1 states and generates control signal DN1 in a logic 1 state in a period when the second divided clock signal VDIV2 is in a logic 0 state. The control signal generator 21 also generates control signal UP2 in a logic 1 state in a period when the first and second divided clock signals VDIV1 and VDIV2 are both in logic 0 states and generates control signal DN2 in a logic 1 state in a period when the second divided clock signal VDIV2 is in a logic 1 state and the first divided clock signal VDIV1 is in a logic 0 state.

The pump signal generator 17 has devices therein which generate the first and second analog pump signals VPUMP1 and VPUMP2. In particular, switch 23a operates to clamp the first analog pump signal line VPUMP1 (designated by reference numeral 27) at a reference potential VREF when the second divided clock signal is in a logic 1 state and the first divided clock signal VDIV1 is in a logic 0 state. As illustrated, this clamping operation is achieved using an inverter which is responsive to VDIV1 and an AND gate which is responsive to /VDIV1 and VDIV2. A capacitor 23f is also provided to maintain the voltage level of the first analog pump signal line VPUMP1 when switches 23a–23c are open. Pull-up switch 23b is also responsive to control signal UP1 and pull-down switch 23c is responsive to control signal DN1. As illustrated, when pull-up switch 23b is closed in response to a logic 1 control signal UP1, a pull-up current source 23d supplies charge to the first analog pump signal line VPUMP1. Alternatively, when pull-down switch 23c is closed in response to a logic 1 control signal DN1, a pull-down current source 23c withdraws charge from the first analog pump signal line VPUMP1. These pull-up and pull-down current sources supply and sink current at the same rate. These aspects of the present invention are illustrated by the timing diagram of FIG. 4, where time interval Tr1 illustrates a pull-up time interval and time interval Tr2 illustrates a pull-down time interval.

Similarly, switch 25a operates to clamp the second analog pump signal line VPUMP2 (designated by reference numeral 29) at a reference potential VREF when the second divided clock signal is in a logic 0 state and the first divided clock signal VDIV1 is in a logic 1 state. As illustrated, this clamping operation is achieved using an inverter which is responsive to VDIV2 and an AND gate which is responsive to /VDIV2 and VDIV1. A capacitor 25f is also provided to maintain the voltage level of the second analog pump signal line VPUMP2 when switches 25a–25c are open. Pull-up switch 25b is also responsive to control signal UP2 and pull-down switch 25c is responsive to control signal DN2. As illustrated, when pull-up switch 25b is closed in response to a logic 1 control signal UP2, a pull-up current source 25d supplies charge to the second analog pump signal line VPUMP2. Alternatively, when pull-down switch 25c is closed in response to a logic 1 control signal DN2, a pull-down current source 25c withdraws charge from the second analog pump signal line VPUMP2. These pull-up and pull-down current sources supply and sink current at the same rate. These aspects of the present invention are also illustrated by the timing diagram of FIG. 4, where time interval Tr1 illustrates a pull-up time interval and time interval Tr2 illustrates a pull-down time interval. These time intervals Tr1 and Tr2 are preferably equivalent.

Referring now to FIG. 3, the preferred driver circuit 19 generates the internal clock signal INTCLK in response to the first and second analog pump signals VPUMP1 and VPUMP2. As illustrated, the driver circuit 19 comprises first and second operational amplifiers 31 and 33 that are responsive to the first and second analog pump signals VPUMP1 and VPUMP2. Because the positive (+) terminal of each amplifier is responsive to the reference potential VREF, the output VCOM1 of the first operational amplifier 31 will be driven to a logic 1 potential whenever the magnitude of VPUMP1 is less than VREF and the output VCOM2 of the second operational amplifier 33 will be driven to a logic 1 potential whenever the magnitude of VPUMP2 is less than VREF. Alternatively, the output VCOM1 of the first operational amplifier 31 will be driven from a logic 1 potential to a logic 0 potential whenever the magnitude of VPUMP1 increases above VREF and the output VCOM2 of the second operational amplifier 33 will be driven from a logic 1 potential to a logic 0 potential whenever the magnitude of VPUMP2 increases above VREF. A buffer circuit 35 is also provided. This buffer circuit 35 includes a NOR gate 35a and a chain 35b of four (4) inverters which convert the output of the NOR gate 35a at node N35 into an internal clock signal INTCLK.

Based on this configuration of the driver circuit 19, the rising and falling edges of the internal clock signal INTCLK which be synchronized with the analog pump signals VPUMP1 and VPUMP2. In particular, the internal clock signal INTCLK will transition from low to high whenever the magnitude of VPUMP1 drops below VREF or the magnitude of VPUMP2 drops below VREF. The internal clock signal INTCLK will also transition from high to low whenever the magnitude of VPUMP1 rises above VREF or the magnitude of VPUMP2 rises above VREF. However, as illustrated by FIG. 4, the leading or trailing edges of the internal clock signal INTCLK will be delayed by a second delay time dt2 relative to when the analog pump signals cross the VREF threshold.

Referring now to FIG. 4, a timing diagram is provided which illustrates the generation of a buffered clock signal ICLK. As illustrated, the buffered clock signal has the same frequency as the external clock signal EXTCLK, but is delayed by a time interval equal to "dtb". The delayed clock signal IDCLK at the output of the delay mirror circuit 13 also has the same frequency as the external clock signal, but is delayed relative to the buffered clock signal ICLK by a time interval equal to "dtot". The first divided clock signal VDIV1 also has a period which is two times the period TCLK of the external clock signal EXTCLK. A rising edge of the first divided clock signal VDIV1 is also delayed relative to a rising edge of the external clock signal by a time interval equal to dtb+dtot+dt1. The second divided clock signal VDIV2 also has a period which is two times the period of the external clock signal EXTCLK. A rising edge of the second divided clock signal VDIV2 is delayed relative to a rising edge of the external clock signal by a time interval equal to dtb+dt1.

As also illustrated by FIG. 4, the voltage level of signal line VPUMP1 starts to increase in response to a rising edge of the first divided clock signal VDIV1. This increase is then terminated in response to a falling edge of the second divided clock signal VDIV2. Thus, the duration of the rise time Tr1 required for the voltage on signal line VPUMP1 to reach a peak voltage VPEAK1 can be determined by the following equation:

$$Tr1 = TCLK - dtot \qquad (1)$$

where TCLK represents the period of the external clock signal EXTCLK.

The rate at which the voltage level of signal line VPUMP1 decreases is the same as its rate of increase. Thus, the time Tr2 required for the voltage level of signal line VPUMP1 to return from VPEAK1 to the reference voltage VREF also equals TCLK-dtot. The timing of the signals on signal line VPUMP2 are similar to those on signal line VPUMP1. Based on the above discussion, the time interval Texint from the rising edge of the external clock signal EXTCLK to the rising edge of the internal clock signal INTCLK is determined by the following equation:

$$Texint = dtb + dtot + dt1 + 2(TCLK - dtot) + dt2 = 2TCLK \qquad (2)$$

Thus, after only 2 clock periods (2TCLK) from the rising edge of the external clock signal EXTCLK, the rising edge of the internal clock signal INTCLK becomes in-sync with the external clock signal EXTCLK.

As described above with reference to FIG. 2, an activation signal ACT may also be provided to the control signal generator 21. The activation signal ACT operates to initialize the first and second pumping signals VPUMP1 and VPUMP2 to the reference voltage REF, thereby preventing malfunction which may occur during conversion of the device from a power-down mode to an activation mode.

An embodiment in which the external clock signal EXTCLK is buffered by the input buffer 11 has been described in detail. When the input buffer 11 is used, the sum of the fixed delays dt1 and dt2 and the fixed buffer delay time dtb should be designed to equal the first delay-mirror time "dtot". However, the external clock signal EXTCLK may be input directly, without passing through the input buffer 11. In this case, the delay-mirrored time dtot should be designed to equal the sum of the first delay time dt1 and the second delay time dt2, with the time required by the pumping signal generator 17 being subtracted from the delay time between the external clock signal EXTCLK and the internal clock signal INTCLK. The time Texint1 is also changed, as illustrated by equation (3):

$$Texint1 = dtot + dt1 + 2(TCLK - dtot) + dt2 = 2TCLK \qquad (3)$$

Thus, even if the input buffer 11 is removed, the rising edge of the internal clock signal INTCLK becomes in-sync with the external clock signal EXTCLK after only two clock periods.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   a clock buffer for receiving an external clock signal and buffering the external clock signal with a buffer delay time and generating a buffered clock signal;
   a clock frequency divider circuit for dividing frequencies of the buffered clock signal and generating first and second divided clock signals which are out-of-phase relative to each other but have the same frequency; and
   a clock generator circuit that converts the first and second divided clock signals into an internal clock signal having a frequency that is N times the frequency of the first and second divided clock signals, where N is an integer greater than one.

2. The device of claim 1, wherein said frequency divider circuit is responsive first and second clock signals that have the same frequency but are out-of-phase relative to each other.

3. The device of claim 2, further comprising a delay mirror circuit that receives the buffered clock signal and generates the second clock signal as a delayed version of the first clock signal with a delay-mirror time.

4. The device of claim 3, wherein the first and second divided clock signals are out-of-phase relative to each other by a first delay; and wherein the first and second clock signals are out-of-phase relative to each other by the first delay.

5. The device of claim 4, wherein said clock frequency divider circuit comprises first and second T-type flip-flops that generate the first and second divided clock signals, respectively; and wherein the first and second T-type flip-flops are responsive to the second and first clock signals with a second delay time, respectively.

6. The device of claim 5, wherein said clock generator circuit comprises:
   a control signal generator that generates first and second pairs of up/down control signals in response to the first and second divided clock signals;
   a pump signal generator that generates first and second analog pump signals in response to the first pair of up/down control signals and second pair of up/down control signals, respectively; and
   a driver circuit that generates the internal clock signal in response to the first and second analog pump signals.

7. The device of claim 6, wherein said driver circuit comprises first and second comparator circuits therein that are responsive to the first and second analog pump signals, and a buffer circuit therein that generates the internal clock signal responding to the output signal of the first and second comparator circuits, with a third delay time.

8. The device of claim 7, wherein said delay-mirror time is the sum of the first delay time, the second delay time and the buffer delay time.

9. The device of claim 7, wherein said first and second comparator circuits comprise first and second operational amplifiers, respectively.

10. The device of claim 9, wherein said first and second operational amplifiers each have first terminals responsive to the first and second analog pump signals, respectively; and wherein second terminals of said first and second operational amplifiers are responsive to a reference signal having a fixed potential.

11. An internal clock generating circuit comprising:
   a clock buffer for receiving an external clock signal and buffering the external clock signal with a buffer delay time and generating a buffered clock signal;
   a delay mirroring circuit for receiving the buffered clock signal and generating a delayed clock signal delayed by a predetermined delay-mirrored time;
   a clock frequency divider for dividing frequencies of the delayed clock signal and the buffered clock signal by ½ with a predetermined first delay time, respectively, to generate a delayed and divided signal and a buffered divided signal;
   a pumping signal generator for generating a first pumping signal whose voltage level increases during a predetermined first time variation ratio in response to a rising edge of the delayed and divided signal and decreases during the first time variation ratio in response to a falling edge of the buffered divided signal, and a second pumping signal whose voltage level increases during a predetermined second time variation ratio in response to a falling edge of the delayed and divided signal and decreases during the second time variation ratio in response to a rising edge of the buffered divided signal; and
   a driving portion for receiving the first and second pumping signals and generating an internal clock signal activated to a high level when at least one voltage level of those of the first and second pumping signals is lower than a predetermined reference voltage.

12. The internal clock signal generating circuit according to claim 11, wherein the pumping signal generator comprises:
   a control signal generator for generating a first up-control signal activated to a high level in a period during which the delayed and divided signal and the external divided signal are both activated to a high level, a first down-control signal activated to a high level in a period during which the external divided signal is deactivated to a low level, a second up-control signal activated to a high level in a period during which the delayed and divided signal and the external divided signal are both deactivated to a low level, and a second down-control signal activated to a high level in a period during which the external divided signal is activated to a high level;
   a first pump for generating the first pumping signal whose voltage level is the same as that of the reference voltage in a period during which the external divided signal is activated to a high level and the delayed and divided signal is deactivated to a low level, whose voltage level increases during the first time variation ratio in response to the activation of the first up-control signal, and whose voltage level decreases during the first time variation ratio in response to the activation of the first down-control signal; and a second pump for generating the second pumping signal whose voltage level is the same as that of the reference voltage in a period during which the external divided signal is deactivated to a low level and the delayed and divided signal is activated to a high level, whose voltage level increases during the second time variation ratio in response to the activation of the second up-control signal, and whose voltage level decreases during the second time variation ratio in response to the activation of the second down-control signal.

13. The internal clock signal generating circuit according to claim 12, wherein the first pump comprises:

a first pumping signal port for generating the first pumping signal;

a first switching element for connecting the first pumping signal port to a reference voltage port from which the reference voltage is generated in a period during which the external divided signal is activated to a high level and the delayed and divided signal is deactivated to a low level;

a current source for supplying a predetermined amount of current from an external power voltage;

a current sink for sinking the current from the current source to a ground voltage;

a second switching element for connecting the current source to the first pumping signal port in response to the first up-control signal; and a third switching element for connecting the current sink to the first pumping signal port in response to the first down-control signal.

14. The internal clock signal generating circuit according to claim 12, wherein the second pump comprises:

a second pumping signal port for generating the second pumping signal;

a first switching element for connecting the second pumping signal port to a reference voltage port from which the reference voltage is generated in a period during which the external divided signal is deactivated to a low level and the delayed and divided signal is activated to a high level;

a current source for supplying a predetermined amount of current from an external power voltage;

a current sink for sinking the current from the current source to a ground voltage;

a second switching element for connecting the current source to the second pumping signal port in response to the second up-control signal; and a third switching element for connecting the current sink to the second pumping signal port in response to the second down-control signal.

15. The internal clock signal generating circuit according to claim 11, wherein the driving portion comprises:

a first comparator for comparing the voltage of the first pumping signal with the reference voltage to generate a first comparison signal;

a second comparator for comparing the voltage of the second pumping signal with the reference voltage to generate a second comparison signal; and an output portion for receiving the first and second comparison signals and outputting the internal clock signal activated to a high level with a second delay time when the voltage level of either the first or second pumping signal is lower than that of the reference voltage.

16. The device of claim 15, wherein said delay-mirror time is the sum of the first delay time, the second delay time and the buffer delay time.

17. A synchronous dynamic random access memory (SDRAM) comprising an internal clock generating circuit, wherein the internal clock generating circuit comprises:

a clock buffer for receiving an external clock signal and buffering the external clock signal with a buffer delay time and generating a buffered clock signal;

a delay mirroring circuit for receiving a buffered clock signal and generating a delayed clock signal delayed by a predetermined delay-mirrored time;

a clock frequency divider for dividing frequencies of the delayed clock signal and the buffered clock signal by ½ with a predetermined first delay time, respectively, to generate a delayed and divided signal and a buffered divided signal;

a pumping signal generator for generating a first pumping signal whose voltage level increases during a predetermined first time variation ratio in response to a rising edge of the delayed and divided signal and decreases during the predetermined first time variation ratio in response to a falling edge of the buffered divided signal, and a second pumping signal whose voltage level increases during a predetermined second time variation ratio in response to a falling edge of the delayed and divided signal and decreases during the predetermined second time variation ratio in response to a rising edge of the buffered divided signal; and a driving portion for receiving the first and second pumping signals and generating an internal clock signal activated to a high level when at least one voltage level of those of the first and second pumping signals is lower than a predetermined reference voltage.

* * * * *